(12) United States Patent
Iwai et al.

(10) Patent No.: US 10,170,202 B2
(45) Date of Patent: Jan. 1, 2019

(54) MEMORY SYSTEM

(71) Applicant: TOSHIBA MEMORY CORPORATION, Tokyo (JP)

(72) Inventors: Makoto Iwai, Chigasaki Kanagawa (JP); Hideaki Tsunashima, Kawasaki Kanagawa (JP); Akio Okazaki, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/252,195

(22) Filed: Aug. 30, 2016

(65) Prior Publication Data

US 2017/0075596 A1   Mar. 16, 2017

(30) Foreign Application Priority Data

Sep. 10, 2015 (JP) ................. 2015-178457

(51) Int. Cl.
| | | |
|---|---|---|
| G11C 29/00 | (2006.01) | |
| G11C 29/52 | (2006.01) | |
| G06F 11/10 | (2006.01) | |
| G11C 16/34 | (2006.01) | |
| G11C 29/44 | (2006.01) | |
| G11C 16/04 | (2006.01) | |

(52) U.S. Cl.
CPC .......... *G11C 29/52* (2013.01); *G06F 11/1068* (2013.01); *G11C 16/3459* (2013.01); *G11C 29/4401* (2013.01); *G11C 16/0483* (2013.01)

(58) Field of Classification Search
None
See application file for complete search history.

(56) References Cited

U.S. PATENT DOCUMENTS

| | | |
|---|---|---|
| 6,601,132 B2 | 7/2003 | Nomura et al. |
| 7,437,602 B2 | 10/2008 | Asari et al. |
| 7,996,735 B2 | 8/2011 | Terao et al. |
| (Continued) | | |

FOREIGN PATENT DOCUMENTS

| | | |
|---|---|---|
| JP | H06-131886 | 5/1994 |
| JP | 2005-284700 | 10/2005 |
| JP | 2008192240 A | 8/2008 |

OTHER PUBLICATIONS

Taiwanese Office Action dated Dec. 30, 2016, filed in Taiwanese counterpart Patent Application No. 105107083, 8 pages (with English Translation).

(Continued)

*Primary Examiner* — Mujtaba M Chaudry
(74) *Attorney, Agent, or Firm* — Patterson & Sheridan, LLP

(57) ABSTRACT

A memory system includes a semiconductor storage device that includes a plurality of blocks, and a controller configured to designate a block of the semiconductor storage device as a partial bad block if, after performing a write operation on the block, status information read from the semiconductor storage device indicates that the write operation failed, and read data that is returned when a read operation is performed on data written pursuant to the write operation has errors that are correctable. The controller is configured to manage a partial bad block differently from a bad block.

13 Claims, 10 Drawing Sheets

(56) References Cited

U.S. PATENT DOCUMENTS

| | | | |
|---|---|---|---|
| 2008/0285347 A1* | 11/2008 | Byeon | G11C 29/76 365/185.09 |
| 2009/0199056 A1* | 8/2009 | Murata | G06F 11/1008 714/704 |
| 2015/0074476 A1* | 3/2015 | Kim | G11C 29/44 714/723 |
| 2015/0131379 A1* | 5/2015 | Oh | G11C 16/08 365/185.12 |
| 2015/0187442 A1* | 7/2015 | Sivasankaran | G11C 29/765 365/185.09 |
| 2016/0019111 A1* | 1/2016 | Kochar | G06F 11/1068 714/6.12 |
| 2016/0055918 A1* | 2/2016 | Kochar | G11C 16/3445 365/185.11 |

OTHER PUBLICATIONS

Taiwan Office Action dated Dec. 26, 2017, filed in Taiwan counterpart Application No. 105107083, 8 pages (with translation).
Japanese Office Action dated May 29, 2018, filed in Japanese counterpart Application No. 2015-178457, 8 pages (with translation).

* cited by examiner

MEMORY SYSTEM

CROSS-REFERENCE TO RELATED APPLICATION

This application is based upon and claims the benefit of priority from Japanese Patent Application No. 2015-178457, filed Sep. 10, 2015, the entire contents of which are incorporated herein by reference.

FIELD

Embodiments described herein relate generally to a memory system including a semiconductor storage device.

BACKGROUND

A NAND flash memory is known as one type of a semiconductor storage device.

DETAILED DESCRIPTION

Embodiments provide a memory system capable of increasing a lifetime of a memory system including a semiconductor storage device.

In general, according to one embodiment, a memory system includes a semiconductor storage device that includes a plurality of blocks, and a controller configured to designate a block of the semiconductor storage device as a partial bad block if, after performing a write operation on the block, status information read from the semiconductor storage device indicates that the write operation failed, and read data that is returned when a read operation is performed on data written pursuant to the write operation has errors that are correctable. The controller is configured to manage a partial bad block differently from a bad block.

Hereinafter, embodiments will be described with reference to the drawings.

A semiconductor storage device according to the present embodiment is a nonvolatile semiconductor memory that can electrically rewrite data, and in the following embodiments, a NAND flash memory will be described as an example of the semiconductor storage device.

1. First Embodiment

1-1. Configuration of Memory System

Figure 1:
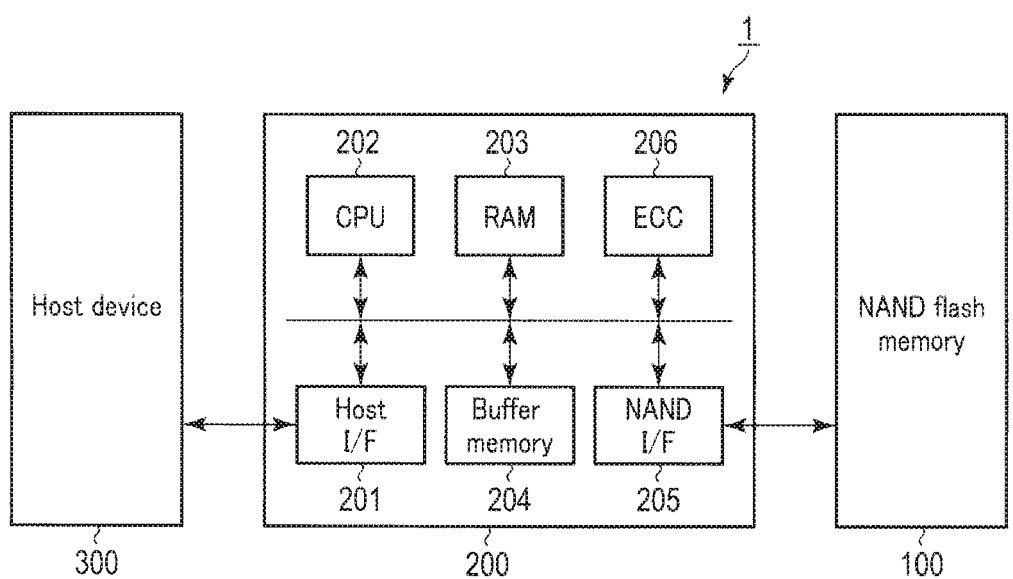
FIG. 1 is a block diagram of a memory system according to a first embodiment.

The configuration of a memory system 1 including a semiconductor storage device according to a first embodiment will be described with reference to FIG. 1. The memory system 1 includes a NAND flash memory 100, and a memory controller 200.

The memory system 1 may be configured by mounting a plurality of chips make up the memory system 1 on a motherboard on which a host device is also mounted, or may be configured using a system on chip (SoC) or a large-scale integrated circuit (LSI) that implements the memory system 1 as one module. Examples of the memory system 1 include a memory card such as an SD™ card, a solid state drive (SSD), and an embedded multimedia card (eMMC).

The NAND flash memory 100 includes a plurality of memory cells, and stores data in a nonvolatile manner. The configuration of the NAND flash memory 100 will be described in detail below.

For example, the memory controller 200 commands the NAND flash memory 100 to write (also referred to as program), read, and erase according to a command from a host device 300. The memory controller 200 manages a memory space of the NAND flash memory 100. The memory controller 200 includes a host interface circuit (host I/F) 201, a central processing unit (CPU) 202, a random access memory (RAM) 203, a buffer memory 204, a NAND interface circuit (NAND I/F) 205, and an error checking and correcting (ECC) circuit 206.

The host interface circuit 201 is connected to the host device 300 through a controller bus, and operates as a communication interface between the host device 300 and the memory controller 200. The host interface circuit 201 transmits and receives commands and data to and from the host device 300.

The CPU 202 controls the entire operation of the memory controller 200. For example, when a write command is received from the host device 300, the CPU 202 issues a write command based on a NAND interface to the NAND flash memory 100 in response to the reception of the write command. The same is applicable to the reading and the erasing. The CPU 202 performs various processes such as wear leveling for managing the NAND flash memory 100.

The RAM 203 is used as a work area of the CPU 202, and stores firmware loaded from the NAND flash memory 100 or various tables created by the CPU 202. The RAM 203 is, for example, a DRAM. The buffer memory 204 temporarily stores data transmitted from the host device 300, and temporarily stores data transmitted from the NAND flash memory 100.

At the time of writing data, the ECC circuit 206 generates an error-correcting code for the write data, and sends the write data including the error-correcting code to the NAND interface circuit 205. At the time of reading data, the ECC circuit 206 performs error detection and error correction for read data by using the error-correcting code contained in the read data. The ECC circuit 206 may be provided within the NAND interface circuit 205.

The NAND interface circuit 205 is connected to the NAND flash memory 100 through a NAND bus, and operates as a communication interface between the memory controller 200 and the NAND flash memory 100. The NAND interface circuit 205 transmits and receives commands and data between the NAND flash memory 100 and the memory controller.

1-1-1. Configuration of NAND Flash Memory 100

Figure 2:
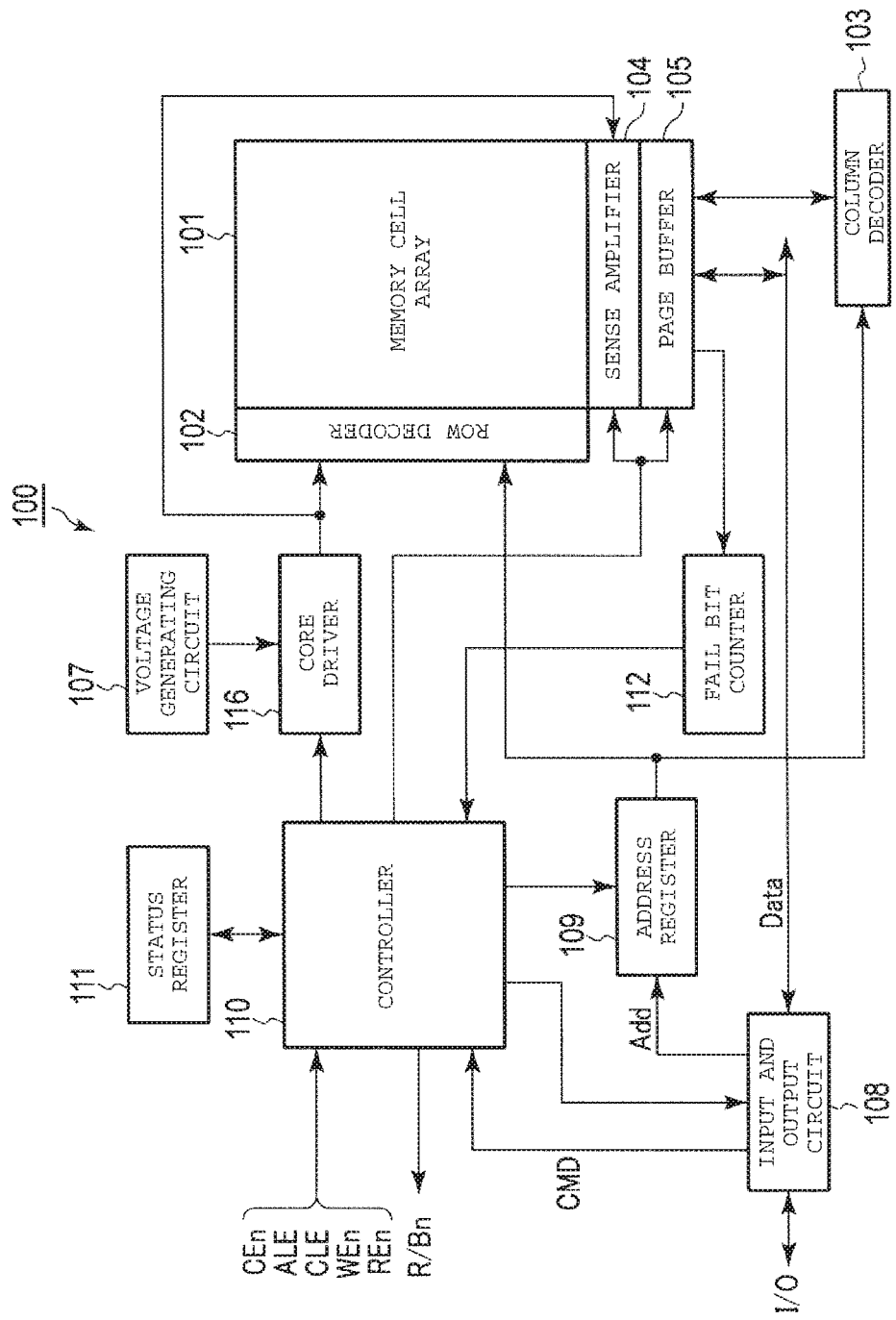
FIG. 2 is a block diagram of a NAND flash memory according to the first embodiment.

The configuration of the NAND flash memory 100 will be described with reference to FIG. 2. The NAND flash memory 100 includes a memory cell array 101, a row decoder 102, a column decoder 103, a sense amplifier 104, a page buffer 105, a core driver 106, a voltage generating circuit 107, an input and output circuit 108, an address register 109, a controller 110, a status register 111, and a fail bit counter 112.

The memory cell array 101 includes a plurality of blocks, and each of the plurality of blocks includes a plurality of memory cell transistors MT (simply referred to as a memory cell in some cases). The memory cell transistor MT is an EEPROM cell that can be electrically rewritten. In order to control voltages applied to the memory cell transistor MT, a plurality of bit lines, a plurality of word lines and a source line are provided in the memory cell array 101. The memory cell array 101 will be described in detail below.

The row decoder 102 receives a block address signal and a row address signal from the address register 109, and selects a word line within the corresponding block based on these signals. The column decoder 103 receives a column address signal from the address register 109, and selects a bit line based on the column address signal.

At the time of reading data, the sense amplifier 104 detects and amplifies data read in the bit line from the memory cell. At time of writing data, the sense amplifier 104 transmits write data to the memory cell. The reading and writing of data from and in the memory cell array 101 are performed using the plurality of memory cells as a unit, and this unit is a page.

The page buffer 105 stores data on a per page basis. At the time of reading data, the page buffer 105 temporarily stores data transmitted on a per page basis from the sense amplifier 104, and serially transmits the data to the input and output circuit 108. At the time of writing data, the page buffer 105 temporarily stores data serially transmitted from the input and output circuit 108, and transmits the data to the sense amplifier 104 on a per page basis.

The core driver 106 supplies voltages required to write, read and erase data, to the row decoder 102, the sense amplifier 104 and a source line control circuit (not shown). The voltages supplied by the core driver 106 are applied to the memory cell (specifically, a word line, a selection gate line, a bit line and a source line) via the row decoder 102, the sense amplifier 104 and the source line control circuit. The voltage generating circuit 107 generates an internal voltage (for example, a voltage obtained by boosting a power supply voltage) required for each operation, and supplies the internal voltage to the core driver 106.

The controller 110 controls the entire operation of the NAND flash memory 100. The controller 110 receives various external control signals, for example, a chip enable signal CEn, an address latch enable signal ALE, a command latch enable signal CLE, a write enable signal WEn, and a read enable signal REn from the memory controller 200.

The controller 110 identifies an address Add and a command CMD supplied from an input and output terminal I/O based on these external control signals. The controller 110 transmits the address Add to the column decoder 103 and the row decoder 102 via the address register 109. The controller 110 decodes the command CMD. The controller 110 performs the respective sequential controls of the reading, writing and easing of data according to the external control signals and the command CMD. In order to notify the memory controller 200 of the operation state of the NAND flash memory 100, the controller 110 outputs a ready/busy signal R/Bn. The memory controller 200 can check the state of the NAND flash memory 100 by receiving the ready/busy signal R/Bn.

The input and output circuit 108 transmits and receives the data (including the command CMD, the address Add and the data) between the memory controller 200 and the NAND flash memory through the NAND bus.

For example, the status register 111 temporarily stores management data read from a ROM fuse of the memory cell array 101 at the time of power-on. The status register 111 temporarily stores various data required for the operation of the memory cell array 101. The status register 111 is, for example, an SRAM.

In a verify operation after the writing, the fail bit counter 112 compares the data read from the memory cell with an expected value, and counts the number of non-coincident bits (fail bits). The verify operation refers to an operation of comparing the data actually written in the memory cell with the expected value (write data) and checking whether or not the expected value is written in the memory cell. The number of fail bits counted by the fail bit counter 112 is used to determine the status of the write operation. That is, the controller 110 compares the number of fail bits counted by the fail bit counter 112 with a threshold value, and determines that the write operation is Pass when the number of fail bits is equal to or less than the threshold value.

1-1-2. Configuration of Memory Cell Array 101

The configuration of the memory cell array 101 will be described with reference to FIG. 3.

The memory cell array 101 includes, for example, two planes PLN0 and PLN1. Each plane PLN is a unit when data is written in the memory cell transistor and data is read from the memory cell transistor. The controller 110 may individually operate the planes PLN0 and PLN1 or may operate the planes in parallel. The number of planes PLN is not limited to two, but may be one or three or more.

Figure 3:
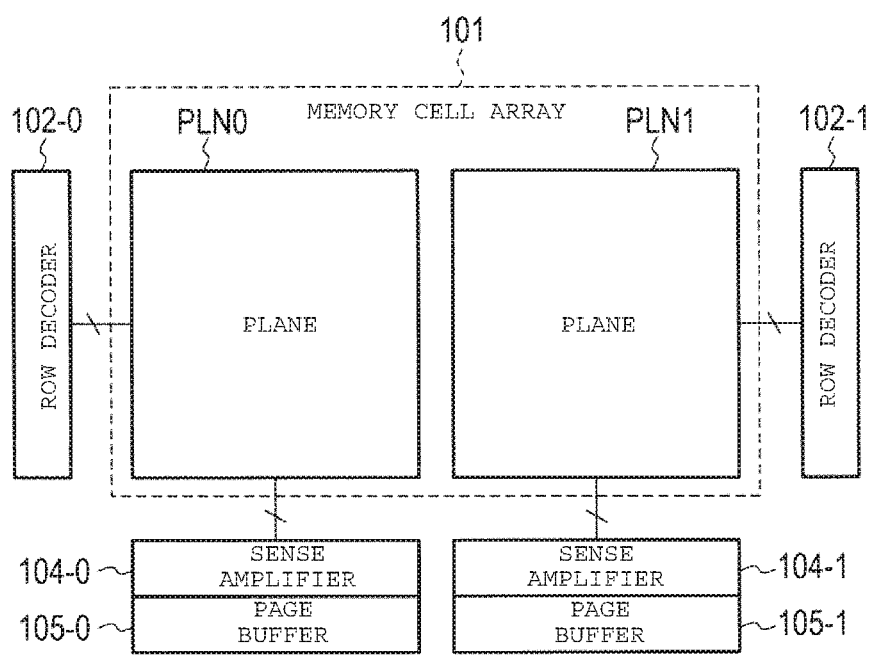
FIG. 3 is a block diagram of a memory cell array shown in FIG. 2.

In the configuration example of the plurality of planes PLN shown in FIG. 3, row decoders 102-0 and 102-1, sense amplifiers 104-0 and 104-1, and page buffers 105-0 and 105-1 are respectively provided in the planes PLN0 and PLN1.

Figure 4:
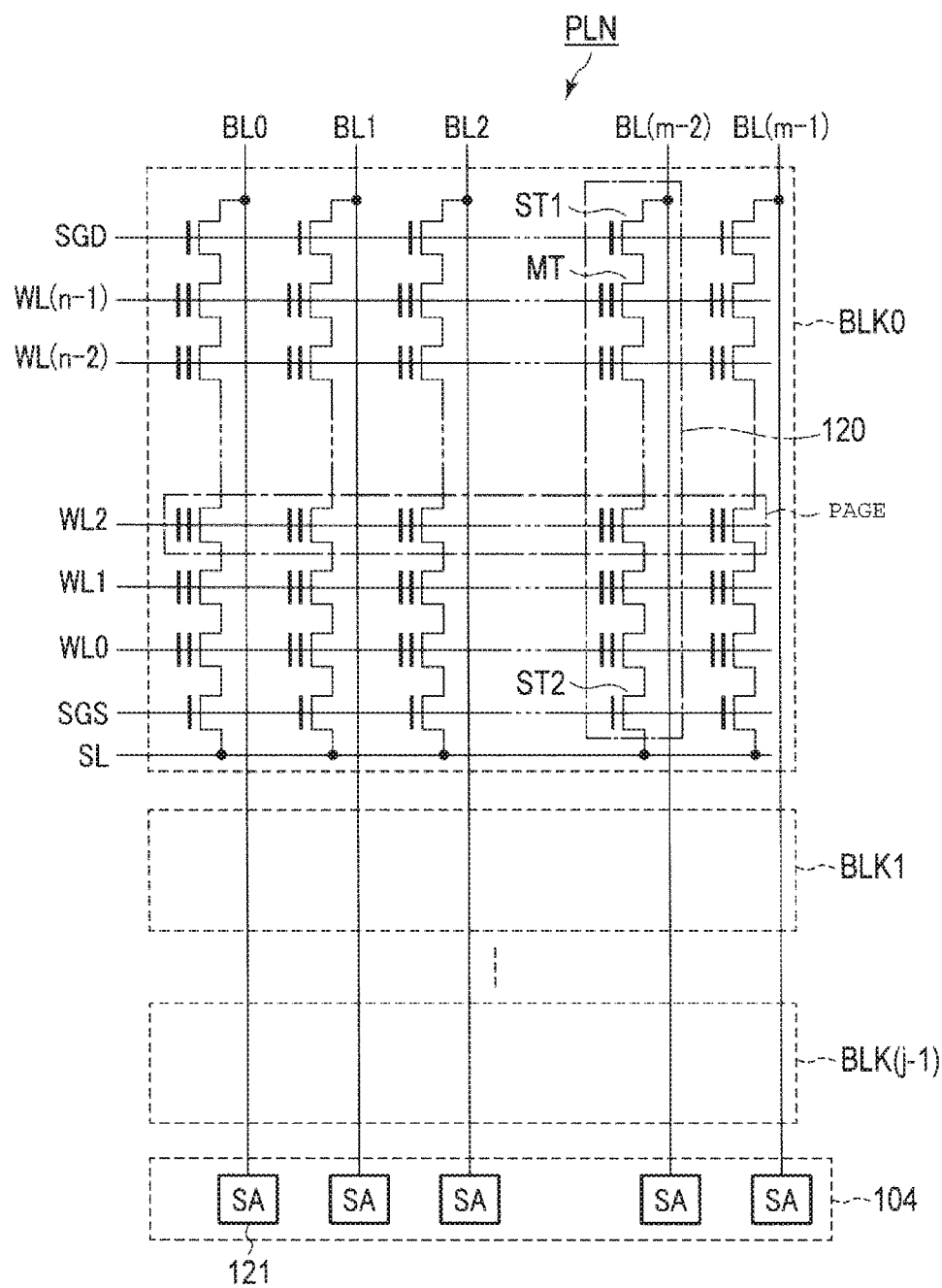
FIG. 4 is a circuit diagram of a plane shown in FIG. 3.

The configuration of the plane PLN will be described with reference to FIG. 4. The plane PLN includes a plurality of blocks BLK (block BLK0 to BLK(j−1)). The number "j" is an integer of 1 or more. Each of the plurality of blocks BLK includes a plurality of NAND strings 120.

Each of the NAND strings 120 includes a plurality (n number) of memory cell transistors MT, and two selection transistors ST1 and ST2. The number "n" is an integer of 1 or more. The memory cell transistor MT includes a stacked gate which includes a control gate and a charge storage layer, and stores data in a nonvolatile manner. The number of memory cell transistors MT included in one NAND string 120 may be arbitrarily set, and is, for example, 8, 16, 32, 64, or 128. The plurality of memory cell transistors MT is arranged such that current paths thereof are connected in series between the selection transistors ST1 and ST2. The current path of the memory cell transistor MT at one end of the series connection is connected to one end of the current path of the selection transistor ST1, and the current path of the memory cell transistor MT at the other end thereof is connected to one end of the current path of the selection transistor ST2.

Gates of the plurality of selection transistors ST1 included in the same block BLK are connected in common to a selection gate line SGD, and gates of the plurality of selection transistors ST2 included in the same block BLK are connected in common to a selection gate line SGS. The control gates of the plurality of memory cell transistors MT included in the same row are connected in common to one line of a plurality of word lines WL (WL0 to WL(n−1)).

The NAND string 120 may include dummy cell transistors. The dummy cell transistors are connected in series between the selection transistor ST1 and the memory cell transistor and between the selection transistor ST2 and the memory cell transistor. Dummy word lines are connected to gates of the dummy cell transistors. The structure of the dummy cell transistor is the same as that of the memory cell transistor. The dummy cell transistor does not store data, and has a function of alleviating a disturbance of the memory cell transistor or the selection transistor during a write pulse application operation or an erase pulse application operation.

Within the plurality of blocks BLK, the other ends of the current paths of the selection transistors ST1 included in the plurality of NAND strings 120 which are present in the same column are connected in common to one of the plurality of bit lines BL (BL0 to BL(m−1)). The number "m" is an integer of 1 or more. That is, one bit line BL connects the NAND strings 120 in the same column in common between the plurality of blocks BLK. A plurality of sense amplifiers (SA) 121 included in the sense amplifier 104 is respectively connected to the plurality of bit lines BL. The other ends of the current paths of the plurality of selection transistors ST2 included in the same block BLK is connected in common to a source line SL. For example, the source line SL connects the NAND strings 120 in common between the plurality of blocks.

Data items of the plurality of memory cell transistors MT in the same block BLK are erased at one time. The reading and writing of data are performed on the plurality of memory cell transistors MT connected in common to one word line WL provided in one block BLK at one time. The data unit is called a page.

1-2. Operation of Memory System 1

Hereinafter, the operation of the memory system 1 having the above-described configuration will be described.

In general, an error block (block that is not capable of normally writing data) in which a program error occurs is managed as a bad block, and the bad block is not used to write data due to low reliability. In the present embodiment, the block in which the program error occurs is not immediately managed as the bad block, and it is determined whether or not data is accurately read by performing an ECC process on the block. When the data is accurately read from the block in which the program error occurs, the block is managed as a partial bad block (bad block candidate) different from the bad block. While the partial bad block is used, data reliability is compensated for by a method such as data multiplexing.

1-2-1. Bad Block Determination Operation

Initially, the flow of a bad block determination operation will be described with reference to FIG. 5. The memory controller 200 writes (programs) data in the NAND flash memory 100 (step S100).

Subsequently, the memory controller 200 reads status information regarding a program of step S100 from the NAND flash memory 100 (steps S101 and S102). When the program status is Pass (step S103: No), the program operation is normally ended.

When the program status is Fail (step S103: Yes), the memory controller 200 reads the data programmed in step S100 from the NAND flash memory 100 (step S104). Thereafter, the memory controller 200 performs error correction on the data read in step S104 (step S105).

When the error correction is normally ended in step S105 (step S105: Pass), the number of error bits of the read data is equal to or less than the error-correcting capability of the ECC circuit 206 (the number of bits of which the error can be corrected), and the memory controller 200 can normally read data from the NAND flash memory 100. In this case, the memory controller 200 manages a block which is a programming target as a partial bad block as distinguished from a bad block, and registers the block which is the programming target as the partial bad block in a management region of the NAND flash memory 100 (step S106). A determination criterion of whether or not the error correction is Pass or Fail may be arbitrarily set. When all error bits are corrected, it may be determined that the error correction is Pass, and when the number of error bits in which the error correction is performed is equal to or less than a threshold, it may be determined that the error correction is Pass.

When the error correction is not normally ended in step S105 (step S105: Fail), the number of error bits of the read data exceeds the error-correcting capability of the ECC circuit 206, and the memory controller 200 cannot normally read data from the NAND flash memory 100. In this case, the memory controller 200 registers the block which is the programming target as the bad block in the management region of the NAND flash memory 100 (step S107). After that, the bad block is excluded from the programming target.

Hereinafter, the bad block determination operation will be described in more detail.

Figure 6:
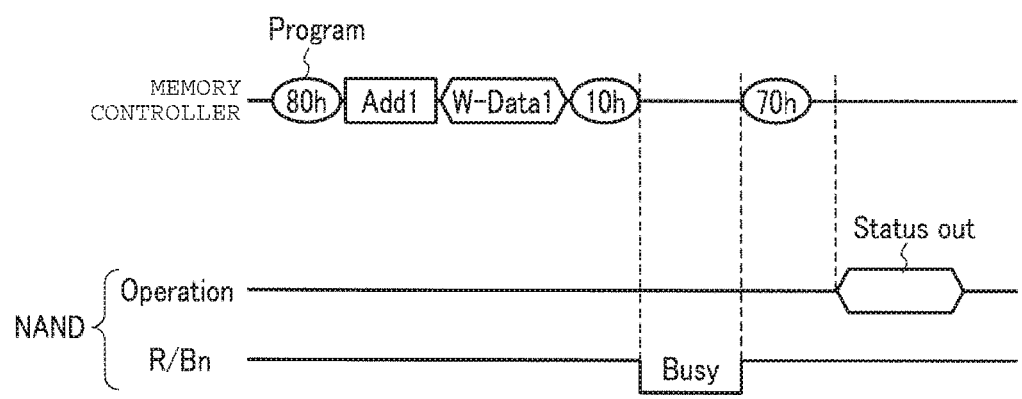
FIGS. 6 and 7 are timing charts for illustrating the bad block determination operation.

As shown in FIG. 6, the memory controller 200 sends a write command "80 h", an address "Add1", write data "W-Data1", and an execution command "10 h" to the NAND flash memory 100. The write data "W-Data1" is, for example, user data, and the address "Add1" is an arbitrary address.

According to the execution command "10 h", the NAND flash memory 100 sends a busy signal to the memory controller 200, and executes the write operation. That is, the controller 110 of the NAND flash memory 100 writes the write data "W-Data1" in the memory cell array 101. After the write operation is ended, the NAND flash memory 100 sends a ready signal to the memory controller 200 (releases the busy signal).

Thereafter, the memory controller 200 sends a status read command "70 h" to the NAND flash memory 100 in response to the ready signal. The NAND flash memory 100 sends status information regarding the write operation to the memory controller 200 according to the status read command "70 h". The memory controller 200 receives the status information read from the NAND flash memory 100, and determines whether or not the write operation of the NAND flash memory 100 is normally ended using the status information (whether or not the program status is Pass or Fail). Operations of Steps S104 and S105 of FIG. 5

Figure 7:
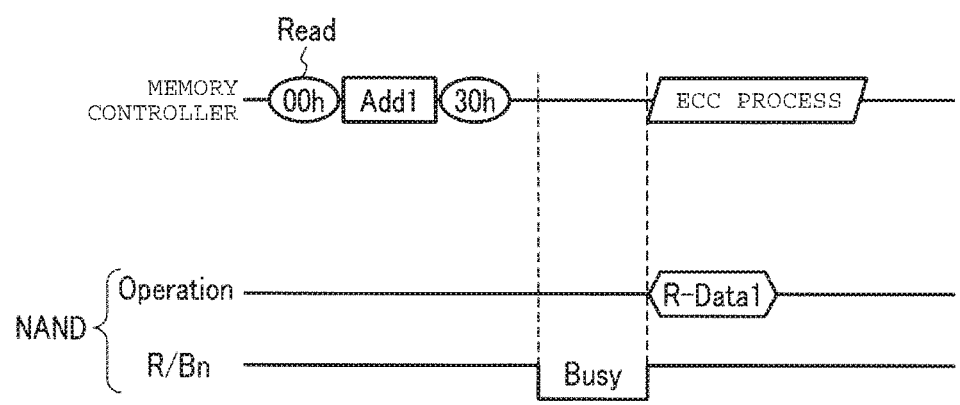

Hereinafter, the read operation when the program status is Fail will be described with reference to FIG. 7.

When the program status is Fail, the memory controller 200 sends a read command "00 h", an address "Add1", and an execution command "30 h" to the NAND flash memory 100. The address "Add1" designated in the read operation is the same as the address "Add1" designated in the write operation of FIG. 6.

According to the execution command "30 h", the NAND flash memory 100 sends the busy signal to the memory controller 200, and performs the read operation. That is, the controller 110 of the NAND flash memory 100 reads data from the memory cell array 101 by using the address "Add1".

After the read operation is ended, the NAND flash memory 100 sends the ready signal to the memory controller 200. Subsequently, the NAND flash memory 100 sends read data "R-Data1" to the memory controller 200. The memory controller 200 receives the read data "R-Data1", and performs the error correction process (ECC process) on the read data "R-Data1".

Figure 5:
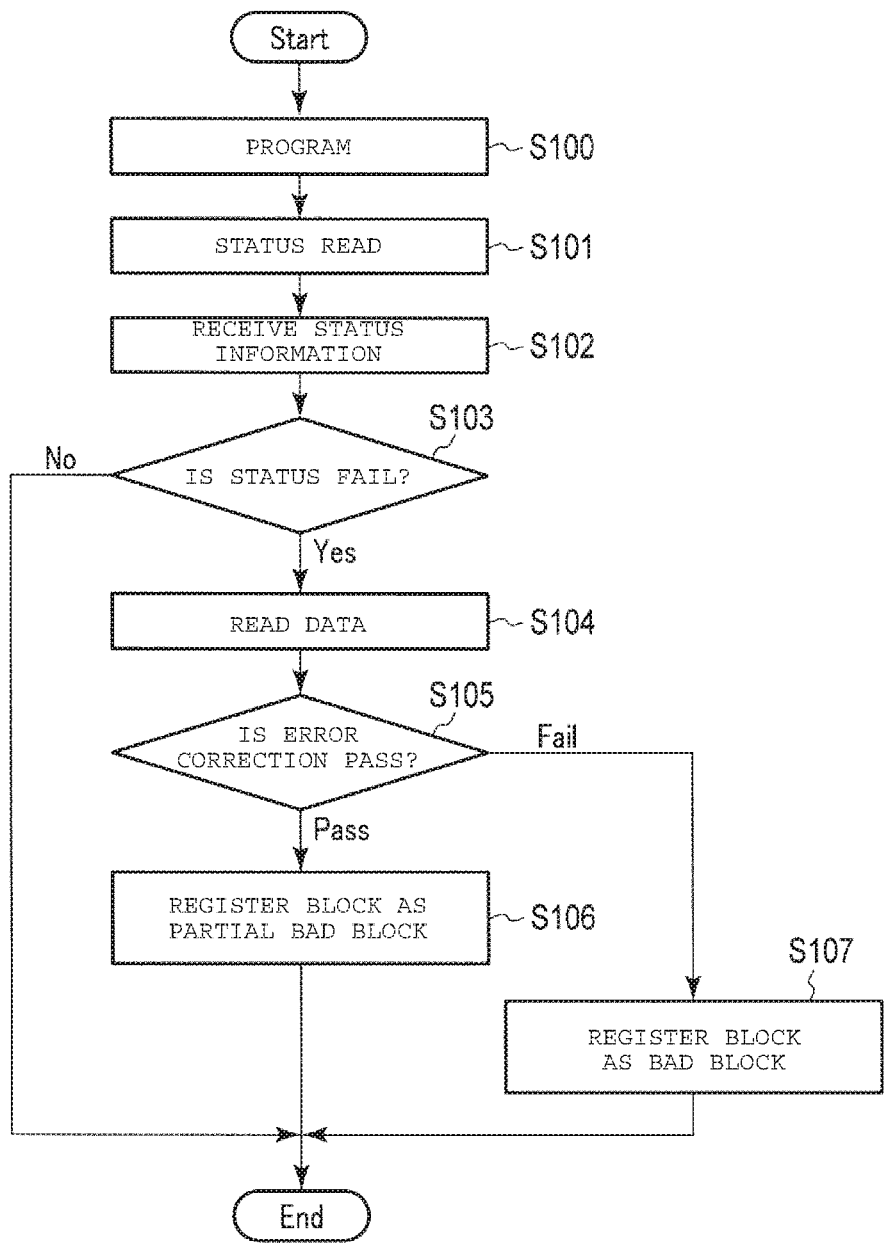
FIG. 5 is a flowchart for illustrating the flow of a bad block determination operation.

Operation of Step S106 of FIG. 5

Figure 8:
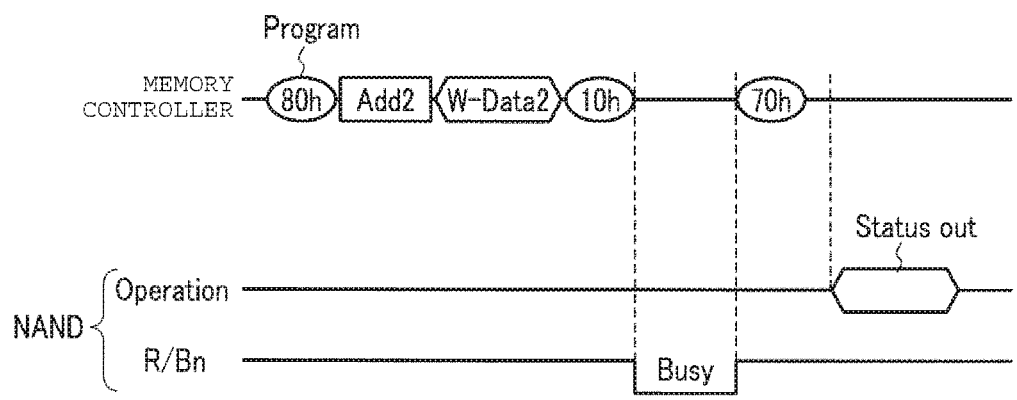
FIG. 8 is a timing chart for illustrating an operation of registering a partial bad block.

As shown in FIG. 5, when the error correction on the read data is normally ended, the block is managed as the partial bad block. An operation of registering the partial bad block will be described with reference to FIG. 8.

When the error correction on the read data is normally ended, the memory controller 200 sends a write command "80 h", an address "Add2", write data "W-Data2", and an execution command "10 h" to the NAND flash memory 100. The address "Add2" is an address that designates a region (management region) for storing management information of the NAND flash memory 100. The write data "W-Data2" is partial bad block information.

According to the execution command "10 h", the NAND flash memory 100 sends the busy signal to the memory controller 200, and performs the write operation. That is, the controller 110 of the NAND flash memory 100 writes the partial bad block information in the management region of the memory cell array 101. The subsequent operation is the same as the write operation of FIG. 6.

The operation of registering the bad block in step S107 is the same as that in the case of the partial bad block except that the address within the management region is different.

Figure 9:
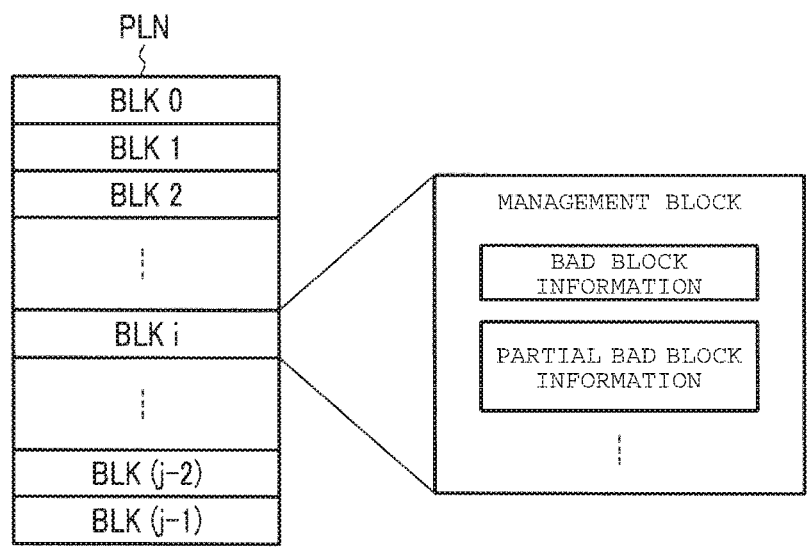
FIG. 9 is a diagram for illustrating a management region of the memory cell array.

FIG. 9 is a diagram for describing the management region of the memory cell array 101. An arbitrary plane PLN included in the memory cell array 101 includes a management block (block BLKi). The management information of the NAND flash memory 100 is stored in the management block BLKi. The management information includes bad block information, and partial bad block information. In addition, the management information includes trimming information.

The bad block information is information regarding the bad block, and is, for example, a block address of the bad block. The partial bad block information is information regarding the partial bad block, and is, for example, a block address of the partial bad block.

As shown in FIG. 9, the partial bad block information is separately managed from the bad block information, and in the following description, an operation suitable for the partial bad block may be performed using the partial bad block information.

1-2-2. Write Operation on Partial Bad Block

The number of error bits generated in the partial bad block is greater than that in a normal block (block other than the bad block and the partial bad block) are generated. Thus, when data is written in the partial bad block, the data is multiplexed, and the data is stored in the NAND flash memory 100.

The write operation on the partial bad block will be described with reference to FIG. 10.

The memory controller 200 sends a read command "00 h", an address "Add2", and an execution command "30 h" to the NAND flash memory 100. The address "Add2" designated in the read operation is the same as the address "Add2" designated in the management region of the NAND flash memory 100 shown in FIG. 8.

According to the execution command "30 h", the NAND flash memory 100 sends the busy signal to the memory controller 200, and performs the read operation. That is, the controller 110 of the NAND flash memory 100 reads data (management information) from the memory cell array 101 by using the address "Add2".

After the read operation is ended, the NAND flash memory 100 sends the ready signal to the memory controller 200. Subsequently, the NAND flash memory 100 sends management information "R-Data2" to the memory controller 200. The memory controller 200 receives the management information "R-Data2", and acquires information (including an address) of the partial bad block by using the management information "R-Data2".

Subsequently, the memory controller 200 sends a write command "80 h", an address "Add3", write data 'W-Data 3", and an execution command "11 h" to the NAND flash memory 100. The address "Add3" is an address of the partial bad block acquired using the management information "R-Data2". For example, it is assumed that the partial bad block is present within the plane PLN0, and it is assumed that the data "W-Data3" is written in the partial bad block. The write data "W-Data3" is, for example, user data.

According to the execution command "11 h", the NAND flash memory 100 sends the busy signal to the memory controller 200, and transmits the data "W-Data3" to the page buffer 105-0 of the plane PLN0. After the data transmission operation is ended, the NAND flash memory 100 sends the ready signal to the memory controller 200.

Thereafter, the memory controller 200 sends a write command "81 h", an address "Add4", write data "W-Data3", and an execution command "10 h" to the NAND flash memory 100 in response to the ready signal. The address "Add4" is an address used to multiplex data, and is, for example, an address that designates a normal block within the plane PLN1. The write data "W-Data3" for the plane PLN1 is the same as the write data "W-Data3" for the above-described plane PLN0.

According to the execution command "10 h", the NAND flash memory 100 sends the busy signal to the memory controller 200, writes the write data "W-Data3" in the partial bad block of the plane PLN0, and writes the write data "W-Data3" in the normal block of the plane PLN1. Accordingly, the multiplexing of data in the memory cell array 101 is realized.

1-2-3 Parameter Changing Operation

Instead of the multiplexing of data described above, a parameter for determining the number of error bits within the NAND flash memory 100 may be changed. A parameter changing operation will be described with reference to FIG. 11. An operation of acquiring information of the partial bad block is the same as that in FIG. 10.

Before the data is written in the partial bad block, the memory controller 200 sends a test mode command "TM" and a parameter to be changed to the NAND flash memory 100. A command for changing the parameter may be arbitrarily set, and in the present embodiment, the test mode command "TM is used as an example. The parameter sent together with the test mode command "TM is information regarding a threshold compared with the number of fail bits (the number of error bits) at the time of program operation.

In the NAND flash memory 100, the program status is determined depending on whether or not the number of fail bits counted by the fail bit counter 112 exceeds a threshold. In the NAND flash memory 100, a write loop which includes the write operation of writing data and the verify operation of checking the written data is repeatedly performed multiple times. Even though the write loop is performed a predetermined number of times, when the number of fail bits exceeds a threshold, it is determined that the program status is Fail. In the present embodiment, in the program operation of the partial bad block, a threshold of the number of fail bits used in the program status is increased relative to that for the normal block. Thus, in the program operation of the partial bad block, the program status is set to be Pass.

According to the test mode command "TM", the NAND flash memory 100 changes the parameter (threshold of the number of fail bits) stored in the status register 111.

After the parameter changing operation is ended, the memory controller 200 sends a write command "80 h", an address "Add1", write data "W-Data1", and an execution command "10 h" to the NAND flash memory 100. The address "Add1" is an address of the partial bad block. The write data "W-Data1" is, for example, user data.

According to the execution command "10 h", the NAND flash memory 100 sends the busy signal to the memory controller 200, and performs the write operation. That is, the controller 110 of the NAND flash memory 100 writes the write data "W-Data1" in the memory cell array 101. After the write operation is ended, the NAND flash memory 100 sends the ready signal to the memory controller 200. After that, similarly to FIG. 8, the program status is determined using a status read command "70 h".

Figure 11:
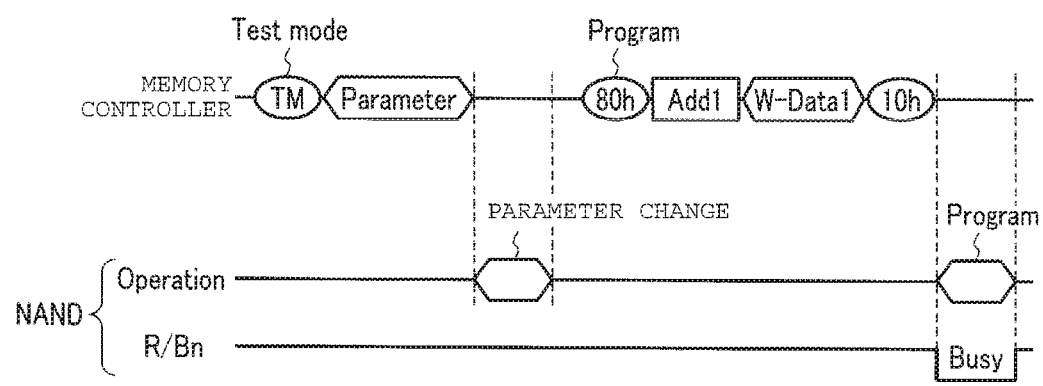
FIG. 11 is a timing chart for illustrating a parameter changing operation.

In the program operation of FIG. 11, a threshold of the number of fail bits used to determine the program status is more increased than that in the normal block. Thus, in the program operation on the partial bad block, it is possible to prevent the program status from being determined to be Fail. The error correction is performed on the read data read from the partial bad block by the memory controller 200.

After the write operation on the partial bad block is ended, a parameter changing operation for a normal block is performed. The parameter changing operation performed again is the same as the above-described parameter changing operation except that the details of the parameter to be written are different.

Figure 10:
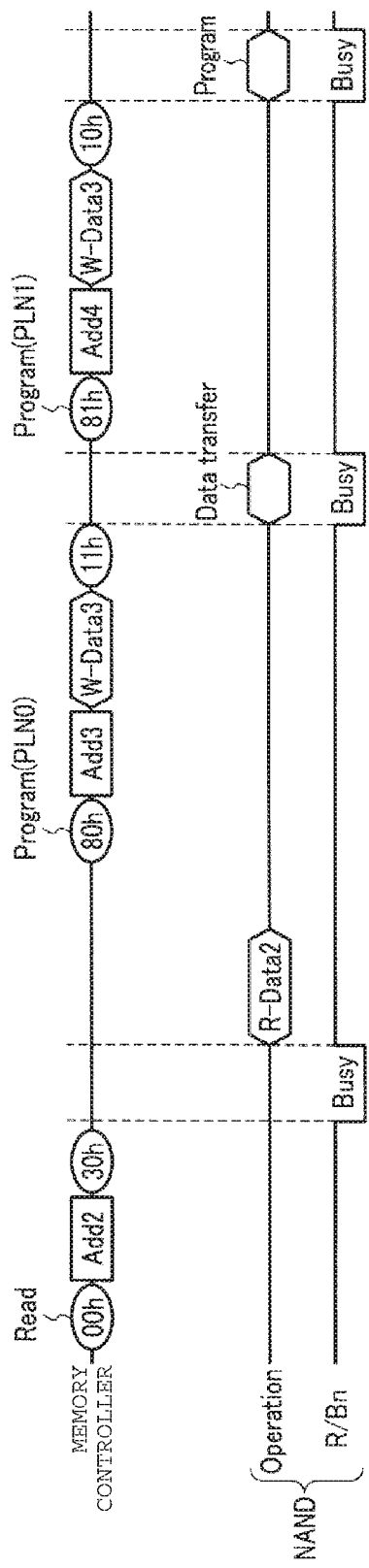
FIG. 10 is a timing chart for illustrating a write operation on the partial bad block.

The parameter changing operation of FIG. 11 may be applied to the data multiplexing operation of FIG. 10. That is, after the parameter changing operation of FIG. 11 is performed, the write operation on the partial bad block, described in FIG. 10, is performed.

1-3. Effects of First Embodiment

In an eMMC, which is one example of the memory system, if the number of bad blocks reaches a certain number, a read only mode (ROM) is operated. The number of bad blocks is calculated by the sum of the number of bad blocks at the time of shipment and the number of acquired bad blocks generated after the shipment. The acquired bad blocks are registered when a program status fail and an erase status fail occur. The status is determined with, for example, several bits/1 KB. The error correction at the time of reading is performed with 40 bits/1 KB which is greater than that at the time of status determination. In such an eMMC, the data is accurately read even though the data is registered in the bad block. Thus, if the bad block is registered even though the data is accurately read, the bad block registration is frequently performed, and thus, there is a concern that the number of defective eMMCs may be increased.

In the present embodiment, the write operation of data is performed in the block of which the program status is determined to be Fail, and the error correction process is performed on the read data. When the error correction process is normally performed, the block is managed as not the bad block but the partial bad block different from the bad block. After that, the block managed as the partial bad block is used as the block which is the programming target.

Thus, according to the present embodiment, the number of blocks registered as the bad block can be reduced. Accordingly, in the specifications in which the defective product is determined when the number of bad blocks exceeds a certain threshold, it is possible to prevent the NAND flash memory 100 from being determined to be the defective product. Therefore, it is possible to increase the lifetime of the memory system 1 including the NAND flash memory 100.

When the data is written in the block managed as the partial bad block, the same data as the data written in the partial bad block is written in the normal block. Thus, it is possible to compensate for the data reliability of the NAND flash memory 100.

Alternatively, when the data is written in the partial bad block, the threshold of the number of fail bits used in the status determination is changed. Accordingly, when the data is written in the partial bad block, it is possible to prevent the program status from being determined as being Fail.

2. Second Embodiment

The second embodiment is an application example to a three-dimensional stacked NAND flash memory in which a plurality of memory cells is stacked on a semiconductor substrate.

Figure 12:
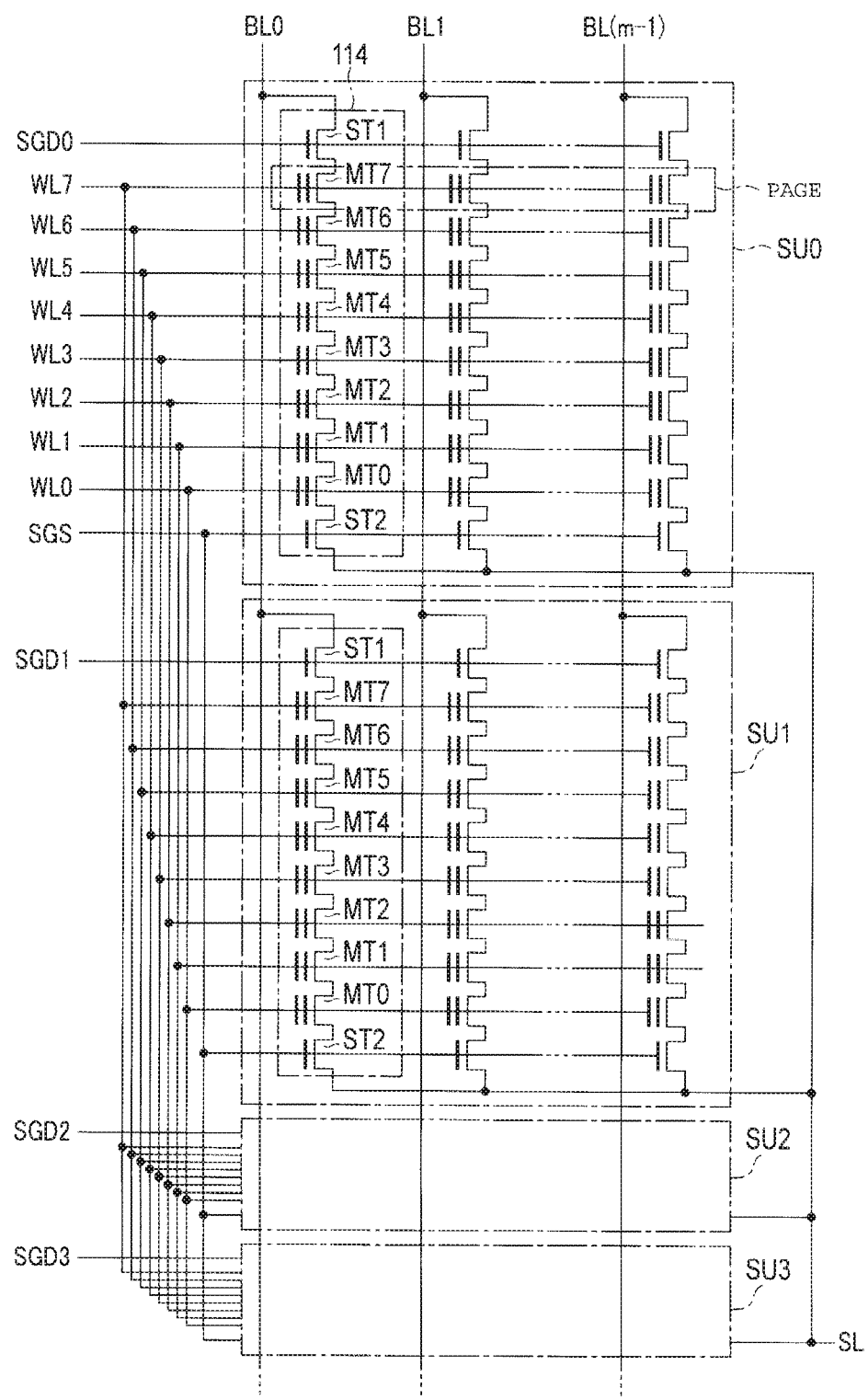
FIG. 12 is a circuit diagram of one block included in a memory cell array according to a second embodiment.

The second embodiment has the same configuration as that of the first embodiment except for the configuration of the memory cell array 101 of the NAND flash memory 100. Similarly to the first embodiment, the memory cell array 101 includes a plurality of blocks BLK. FIG. 12 is a circuit diagram of one block BLK included in the memory cell array 101 according to the second embodiment.

The block BLK includes a plurality of string units SU, and each of the plurality of string units SU includes a plurality of NAND strings 120. For example, four string units SU0 to SU3 are illustrated in FIG. 12. The number of string units SU within one block BLK may be arbitrarily set. FIG. 12 shows a configuration example in which the NAND string 120 includes 8 memory cell transistors MT (MT0 to MT7), but the number of memory cell transistors MT included in the NAND string 120 may be arbitrarily set.

Gates of selection transistors ST1 included in the string unit SU0 are connected in common to a selection gate line SGD0, and selection gate lines SGD1 to SGD3 are similarly connected to the string units SU1 to SU3. Gates of a plurality of selection transistors ST2 present within the same block BLK are connected in common to the same selection gate line SGS. Word lines WL0 to WL7 are respectively connected in common to control gates of the memory cell transistors MT0 to MT7 within the same block BLK. Similarly to the selection transistor ST1, selection transistors ST2 included in each string unit SU may be connected to separate selection gate lines SGS0 to SGS3.

Among the NAND strings 120 arranged in a matrix configuration within the memory cell array 101, the other ends of the current paths of the selection transistors ST1 of the NAND strings 120 present in the same row are connected in common to any of the bit lines BL0 to BL(m−1). That is, one bit line BL connects the NAND strings 120 present in the same column in common between the plurality of blocks BLK. The other ends of the current paths of the selection transistors ST2 are connected in common to a source line SL. For example, the source line SL connects the NAND strings 120 in common between the plurality of blocks.

For example, embodiments may employ any of the configurations of the memory cell array described in U.S. patent application Ser. No. 12/407,403 which is entitled "THREE-DIMENSIONAL STACKED NONVOLATILE SEMICONDUCTOR MEMORY" and is filed on Mar. 19, 2009, in U.S. patent application Ser. No. 12/406,524 which is entitled "THREE-DIMENSIONAL STACKED NONVOLATILE SEMICONDUCTOR MEMORY" and is filed on Mar. 18, 2009, in U.S. patent application Ser. No. 12/679,991 which is entitled "NONVOLATILE SEMICONDUCTOR STORAGE DEVICE AND METHOD OF MANUFACTURING THE SAME" and is filed on Mar. 25, 2010, and in U.S. patent application Ser. No. 12/532,030 which is entitled "SEMICONDUCTOR MEMORY AND METHOD OF MANUFACTURING THE SAME" and is filed on Mar. 23, 2009. All of these patent applications are herein incorporated by reference in its entirety.

The data may be erased in units of a block BLK or in units smaller the block BLK. Such an erasing method is described in U.S. patent application Ser. No. 13/235,389 which is entitled "NONVOLATILE SEMICONDUCTOR MEMORY DEVICE" and is filed on Sep. 18, 2011, in U.S. patent application Ser. No. 12/694,690 which is entitled "NON-VOLATILE SEMICONDUCTOR STORAGE DEVICE" and is filed on Jan. 27, 2010, and in U.S. patent application Ser. No. 13/483,610 which is entitled "NON-VOLATILE SEMICONDUCTOR MEMORY DEVICE AND DATA ERASE METHOD THEREOF" and is filed on May 30, 2012. All of these patent applications are herein incorporated by reference in its entirety.

In the second embodiment, the program status is determined for every string unit SU. The string unit (string unit that is not capable of normally writing data) in which the program error occurs is not managed as a bad string unit, and determines whether or not the data can be accurately read by performing the ECC process on the string unit. When the data is accurately read from the string unit in which the program error occurs, the string unit is managed as a partial bad string unit. Similarly to the first embodiment, while the partial bad string unit is used, data reliability is compensated for by a method such as data multiplexing. In the second embodiment, the operation of the first embodiment is applied except that the status determination for each block is changed to the status determination for each string unit.

When one memory cell transistor MT stores 2-bit data, any of four types of levels is obtained as a threshold voltage thereof depending on the stored data. When the four types of levels are respectively an erase level, level A, level B, and level C in ascending order, a voltage applied to the selection word line at the time of reading the level A is, for example, in a range of 0 V to 0.55 V. The voltage is not limited to the above-described example, but the voltage may be in any range of 0.1 V to 0.24 V, 0.21 V to 0.31 V, 0.31 V to 0.4 V, 0.4 V to 0.5V, and 0.5V to 0.55V. A voltage applied to the selection word line at the time of reading the level B is, for example, in a range of 1.5 V to 2.3 V. The voltage is not limited to the above-described example, but the voltage may be in any range of 1.65 V to 1.8 V, 1.8 V to 1.95 V, 1.95 V to 2.1 V, and 2.1 V to 2.3 V. For example, a voltage applied to the selection word line at the time of reading the level C is, for example, in a range of 3.0 V to 4.0 V. The voltage is not limited to the above-described example, but the voltage may be in any range of 3.0 V to 3.2 V, 3.2 V to 3.4 V, 3.4 V to 3.5 V, 3.5 V to 3.6 V, and 3.6 V to 4.0 V. For example, a time (tR) of the read operation may be in any time zones of 25 μs to 38 μs, 38 μs to 70 μs, and 70 μs to 80 μs.

The write operation includes a program operation, and a program verify operation. In the write operation, a voltage initially applied a word line selected at the time of the program operation is in a range of, for example, 13.7 V to 14.3 V. The voltage is not limited to the above-described example, but may be, for example, in any range of 13.7 V to 14.0 V and 14.0 V to 14.6 V. A voltage initially applied to the selected word line at the time of performing the write operation on an odd-numbered word line and a voltage initially applied to the selected word line at the time of performing the write operation on an even-numbered word line may be different. When the program operation is performed by an incremental step pulse program (ISPP) method, a step-up voltage is, for example, about 0.5 V. For example, a voltage applied to a non-selected word line may be in a range of 6.0 V to 7.3 V. For example, the voltage is not limited to the above-described example, but may be in a range of 7.3 V to 8.4 V, or 6.0 V or less. A pass voltage to be applied may be different depending on whether or not the non-selected word line is an odd-numbered word line or an even-numbered word line. For example, a time (tProg) of the write operation may be in any time zones of 1,700 μs to 1,800 μs, 1,800 μs to 1,900 μs, and 1,900 μs to 2,000 μs.

In the erase operation, a voltage initially applied to a well which is provided in the top of the semiconductor substrate and above which the memory cell is provided is, for example, in a range of 12 V to 13.6 V. The voltage is not limited to the above-described example, but may be, for example, in any range of 13.6 V to 14.8 V, 14.8 V to 19.0 V, 19.0 V to 19.8 V, and 19.8 V to 21 V. A time (tErase) of the erase operation may be, for example, in any time zone of 3,000 μs to 4,000 μs, 4,000 μs to 5,000 μs, and 4,000 μs to 9,000 μs.

The memory cell may have, for example, the following structure. The memory cell includes a charge storage film provided with a tunnel insulating film having a film thickness of 4 nm to 10 nm on a semiconductor substrate such as a silicon substrate. The charge storage film may have a stacked structure of an insulating film such as a silicon oxynitride (SiON) film or a silicon nitride (SiN) film having a film thickness of 2 nm to 3 nm and a polysilicon (Poly-Si) film having a film thickness of 3 nm to 8 nm. Metal such as ruthenium (Ru) may be added to the polysilicon film. The memory cell includes an insulating film on the charge storage film. The insulating film includes, for example, a silicon oxide ($SiO_x$) film having a film thickness of 4 nm to 10 nm interposed between a lower high-k film having a film thickness of 3 nm to 10 nm and an upper high-k film having a film thickness of 3 nm to 10 nm. As a material of the high-k film, hafnium oxide (HfO) is used. The film thickness of the silicon oxide film may be greater than the film thickness of the high-k film. A control electrode having a film thickness of 30 nm to 70 nm is provided on the insulating film an adjusting film having a film thickness of 3 nm to 10 nm interposed therebetween. Here, the adjusting film is a metal oxide film made of tantalum oxide (TaO) or a metal nitride film made of tantalum nitride (TaN). The control electrode may be made of tungsten (W). An air gap may be arranged between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a semiconductor storage device including a plurality of blocks; and
    a controller configured to
        (i) instruct the semiconductor storage device to perform a read operation on data written to a block of the semiconductor storage device to determine whether or not to designate the block as a partial bad block if, after instructing the semiconductor storage device to perform a write operation on the block to write the data, status information read from the semiconductor storage device indicates that the write operation failed, and
        (ii) designate the block as a partial bad block if read data that is returned from the semiconductor storage device in response to the instruction to perform the read operation has errors that are correctable, and as a bad block if read data that is returned from the semiconductor storage device in response to the instruction to perform the read operation has errors that are not correctable,
    wherein the controller is configured to manage a partial bad block differently from a bad block,
    wherein the controller is configured to instruct the semiconductor storage device to increase a threshold number of errors for determining that the write operation failed prior to a subsequent write operation on the block designated as a partial bad block, and
    wherein the controller, after the subsequent write operation on the block designated as a partial bad block, sends a command for decreasing the threshold number of errors to the semiconductor storage device.

2. The system according to claim 1, wherein
    the controller includes an error checking and correcting (ECC) circuit, and
    the errors in the read data are not correctable if the number of bits that need to be corrected is greater than an error-correcting capability of the ECC circuit.

3. The system according to claim 1, wherein the controller designates the block as a partial bad block by instructing the semiconductor storage device to write first information into a management region of the semiconductor storage device and as a bad block by instructing the semiconductor storage device to write second information into the management region of the semiconductor storage device.

4. The system according to claim 1,
    wherein the controller is configured to instruct the semiconductor storage device to perform a subsequent write operation on a block designated as a partial bad block, by instructing the semiconductor storage device to write target data of the subsequent write operation into the block and into another block that is not designated as a partial bad block or a bad block.

5. The system according to claim 4, wherein the plurality of blocks are arranged in multiple planes and said another block is arranged in a plane that is different from a plane in which the partial bad block is arranged.

6. A memory system comprising:
    a semiconductor storage device including a plurality of string units, each of the string units including a plurality of strings, and each of the strings including a plurality of serially-connected memory cells; and
    a controller configured to
        (i) instruct the semiconductor storage device to perform a read operation on data written to a string unit of the semiconductor storage device to determine whether or not to designate the string unit as a partial bad string unit if, after instructing the semiconductor storage device to perform a write operation on the string unit to write the data, status information read from the semiconductor storage device indicates that the write operation failed, and
        (ii) designate the string unit as a partial bad string unit if read data that is returned from the semiconductor storage device in response to the instruction to perform the read operation has errors that are correctable, and as a bad string unit if read data that is returned from the semiconductor storage device in response to the instruction to perform the read operation has errors that are not correctable,
    wherein the controller is configured to manage a partial bad string unit differently from a bad string unit,
    wherein the controller is configured to instruct the semiconductor storage device to increase a threshold number of errors for determining that the write operation failed prior to a subsequent write operation on the string unit designated as a partial bad string unit, and
    wherein the controller, after the subsequent write operation on the string unit designated as a partial bad string unit, sends a command for decreasing the threshold number of errors to the semiconductor storage device.

7. The system according to claim 6, wherein
    the controller includes an error checking and correcting (ECC) circuit, and
    the errors in the read data are not correctable if the number of bits that need to be corrected is greater than an error-correcting capability of the ECC circuit.

8. The system according to claim 6, wherein the controller designates the string unit as a partial bad string unit by instructing the semiconductor storage device to write first information into a management region of the semiconductor storage device and as a bad string unit by instructing the semiconductor storage device to write second information into the management region of the semiconductor storage device.

9. The system according to claim 6,
    wherein the controller is configured to instruct the semiconductor storage device to perform a subsequent write operation on a string unit designated as a partial bad string unit, by instructing the semiconductor storage device to write target data of the subsequent write operation into the string unit and into another string unit that is not designated as a partial bad string unit or a bad string unit.

10. The system according to claim 9, wherein the plurality of blocks are arranged in multiple planes and said another string unit is arranged in a plane that is different from a plane in which the partial bad string unit is arranged.

11. A method of managing blocks of memory cells of a semiconductor storage device as a normal block, a partial bad block, and a bad block, wherein a block represents a group of memory cells that are erased as a unit, comprising:
   instructing the semiconductor storage device to perform a write operation on a block of memory cells;
   reading status information from the semiconductor storage device to determine that the write operation failed;
   upon determining that the write operation failed, instructing the semiconductor storage device to perform a read operation on data written pursuant to the write operation;
   determining whether or not read data returned pursuant to the read operation contain errors that are correctable or not correctable;
   designating the block as a partial bad block upon determining that the read data contain errors that are correctable;
   designating the block as a bad block upon determining that the read data contain errors that are not correctable;
   prior to a subsequent write operation on the block designated as a partial bad block, instructing the semiconductor storage device to increase a threshold number of errors for determining that the write operation failed; and
   after the subsequent write operation on the block designated as a partial bad block, sending a command for decreasing the threshold number of errors to the semiconductor storage device.

12. The method according to claim 11, further comprising:
   instructing the semiconductor storage device to perform a subsequent write operation on a block designated as a partial bad block, by instructing the semiconductor storage device to write target data of the subsequent write operation into the block and into a normal block.

13. The method according to claim 12, wherein the plurality of blocks are arranged in multiple planes and said normal block is arranged in a plane that is different from a plane in which the partial bad block is arranged.

* * * * *